(12) United States Patent
Azuma

(10) Patent No.: US 12,453,991 B2
(45) Date of Patent: Oct. 28, 2025

(54) FOREIGN PARTICLE REMOVING METHOD, FORMATION METHOD, ARTICLE MANUFACTURING METHOD, FOREIGN PARTICLE REMOVING APPARATUS, AND SYSTEM

(71) Applicant: CANON KABUSHIKI KAISHA, Tokyo (JP)

(72) Inventor: Hisanobu Azuma, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 170 days.

(21) Appl. No.: 18/299,255

(22) Filed: Apr. 12, 2023

(65) Prior Publication Data

US 2023/0347390 A1 Nov. 2, 2023

(30) Foreign Application Priority Data

Apr. 27, 2022 (JP) ................. 2022-073676

(51) Int. Cl.
*G03F 7/20* (2006.01)
*B08B 7/00* (2006.01)
(Continued)

(52) U.S. Cl.
CPC ........ *B08B 7/0014* (2013.01); *G03F 7/70925* (2013.01); *H01L 21/02057* (2013.01)

(58) Field of Classification Search
CPC . B08B 7/0014; B08B 7/0028; G03F 7/70925; G03F 1/82; G03F 7/0002; H01L 21/02057; H01L 21/67028; B81C 1/00849
See application file for complete search history.

(56) References Cited

U.S. PATENT DOCUMENTS 6,048,409 A 4/2000 Kanno et al.
8,202,463 B2 6/2012 Yoneda et al.
(Continued)

FOREIGN PATENT DOCUMENTS

JP H08318181 A 12/1996
JP 2007258462 A 10/2007
(Continued)

OTHER PUBLICATIONS

Azuma. Copending U.S. Appl. No. 18/299,319, filed Apr. 12, 2023.
(Continued)

*Primary Examiner* — Mesfin T Asfaw
(74) *Attorney, Agent, or Firm* — ROSSI, KIMMS & McDOWELL LLP

(57) ABSTRACT

The present invention provides a method of removing a foreign particle on a first member, comprising: supplying a composition on the first member; pressing a second member against the composition supplied on the first member; curing the composition on the first member after the pressing; and separating the second member together with the composition from the first member, after the curing, wherein in the supplying, a supply amount of the composition to be supplied on the first member is controlled based on a cure shrinkage rate of the composition in the curing and an estimated size of a foreign particle being presumably adhered on the first member, such that a thickness of a portion of the composition cured in the curing, which exists between the second member and the first member, becomes larger than the estimated size.

20 Claims, 10 Drawing Sheets

(51) Int. Cl.
*G03F 7/00* (2006.01)
*H01L 21/02* (2006.01)

(56) References Cited

U.S. PATENT DOCUMENTS

| | | | |
|---|---|---|---|
| 2009/0267267 A1* | 10/2009 | Yoneda | B82Y 10/00 |
| | | | 264/293 |
| 2013/0224322 A1 | 8/2013 | Shizawa et al. | |
| 2017/0184958 A1 | 6/2017 | Kawamura et al. | |
| 2023/0149982 A1 | 5/2023 | Yonekawa et al. | |
| 2023/0382019 A1 | 11/2023 | Kondo | |

FOREIGN PATENT DOCUMENTS

| | | |
|---|---|---|
| JP | 5121549 B2 | 1/2013 |
| JP | 2015223770 A | 12/2015 |
| JP | 2016072517 A | 5/2016 |
| JP | 5982996 B2 | 8/2016 |
| JP | 6417761 B2 | 11/2018 |
| JP | 6480219 B2 | 3/2019 |
| JP | 6765488 B2 | 10/2020 |
| KR | 1020130014055 A | 2/2013 |
| TW | 201324597 A | 6/2013 |

OTHER PUBLICATIONS

Office Action issued in U.S. Appl. No. 18/299,319, mailed on Mar. 19, 2025.
Notice of Allowance issued in U.S. Appl. No. 18/299,319, mailed Jul. 18, 2025.

* cited by examiner

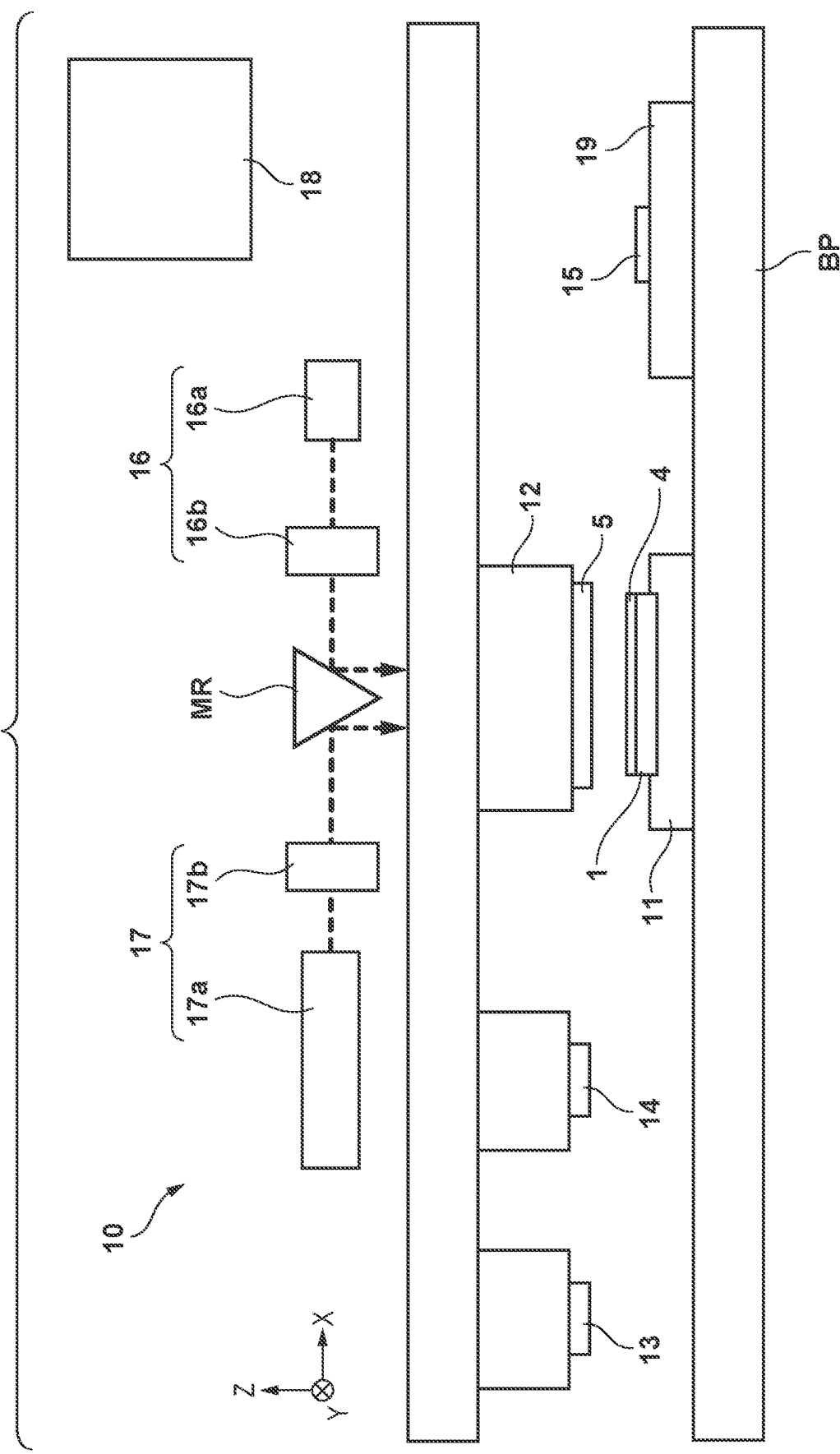

FOREIGN PARTICLE REMOVING METHOD, FORMATION METHOD, ARTICLE MANUFACTURING METHOD, FOREIGN PARTICLE REMOVING APPARATUS, AND SYSTEM

BACKGROUND OF THE INVENTION

Field of the Invention

The present invention relates to a foreign particle removing method, a formation method, an article manufacturing method, a foreign particle removing apparatus, and a system.

Description of the Related Art

In the manufacture of semiconductor devices, MEMS, and the like, a member such as a semiconductor substrate is cleaned. Conventionally, megasonic cleaning, two-fluid cleaning, RCA cleaning using a chemical solution, or the like is applied to cleaning of the member like this. Examples of the cleaning principles of these cleaning methods are a cleaning method of removing foreign particles adhered on a substrate by using the physical force of a hydrodynamic force (see Japanese Patent Laid-Open No. 8-318181), and a cleaning method of removing foreign particles in a lift-off manner by using the chemical action (for example, the etching effect) of a chemical solution (see Japanese Patent Laid-Open No. 2007-258462). Also, as a member cleaning method, each of Japanese Patent Nos. 6765488 and 6480219 describes a cleaning method of forming a solid film on a member so that the solid film entraps foreign particles on the member, and removing the solid film by using a chemical solution.

Recently, as micropatterning in the manufacture of semiconductor devices and the like progresses, cleaning of a member such as a semiconductor substrate is required to remove even foreign particles having very small particle sizes (for example, a few tens of nm or less) from the member. However, in the cleaning method using the hydrodynamic force as described in Japanese Patent Laid-Open No. 8-318181, if the hydrodynamic force is increased in order to remove foreign particles having small particle sizes or an unnecessary material such as a polymer adhered on a member, a microstructure formed as an underlayer (underlying pattern) on the member is sometimes damaged. This damage to the underlayer of the member can similarly occur in the cleaning method using the chemical reaction of a chemical solution as described in Japanese Patent Laid-Open No. 2007-258462 as well. Therefore, the abovementioned cleaning methods are beginning to reach the limit of application regarding to the removal of foreign particles having small particle sizes. In addition, the cleaning methods described in Japanese Patent Nos. 6765488 and 6480219 have the problems that foreign particles sometimes adhere on a member again when dissolving (removing) the solid film by using a chemical solution, and the environmental load and the cost burden of waste liquid treatment and the like are large.

As a member cleaning method, therefore, a cleaning method (also called a dry cleaning method in some cases) of removing foreign particles on a member by using an imprint system instead of using a chemical solution is attracting attention. As an example, Japanese Patent No. 5121549 describes a cleaning method of removing foreign particles on a template by pressing the template against a resin applied on a dummy wafer, and separating the template from the resin after the resin is cured. Also, Japanese Patent No. 5982996 describes a cleaning method of forming a resin film by bringing a planarizing member into contact with a resin applied on a mold as an object of foreign particle removal, curing the resin film, releasing the planarizing member from the resin film, and releasing the resin film from the mold. In the cleaning methods using the imprint system as described above, a composition such as a resin entrapping foreign particles by being spread between two members is cured. If the cure shrinkage of the composition is not taken into consideration, therefore, a member or the like as an object of foreign particle removal is sometimes damaged depending on the size of a foreign particle.

SUMMARY OF THE INVENTION

The present invention provides, for example, a technique capable of reducing damages to a member when removing foreign particles on the member.

According to one aspect of the present invention, there is provided a foreign particle removing method of removing a foreign particle on a first member having a pattern with concave and convex portions, comprising: supplying a composition on the first member; pressing a second member against the composition supplied on the first member in the supplying, such that the composition spreads on the first member and entraps a foreign particle on the first member; curing the composition on the first member after the pressing, in a state in which the composition and the second member are in contact with each other; and separating the second member together with the composition from the first member, after the curing, wherein in the supplying, a supply amount of the composition to be supplied on the first member is controlled based on a cure shrinkage rate of the composition in the curing and an estimated size of a foreign particle being presumably adhered on the first member, such that a thickness of a portion of the composition cured in the curing, which exists between the second member and a convex portion of the pattern of the first member, becomes larger than the estimated size.

Further features of the present invention will become apparent from the following description of exemplary embodiments with reference to the attached drawings.

BRIEF DESCRIPTION OF THE DRAWINGS

FIG. 7 is a schematic view showing a configuration example of a foreign particle removing apparatus of the first embodiment;

DESCRIPTION OF THE EMBODIMENTS

Figure 1:
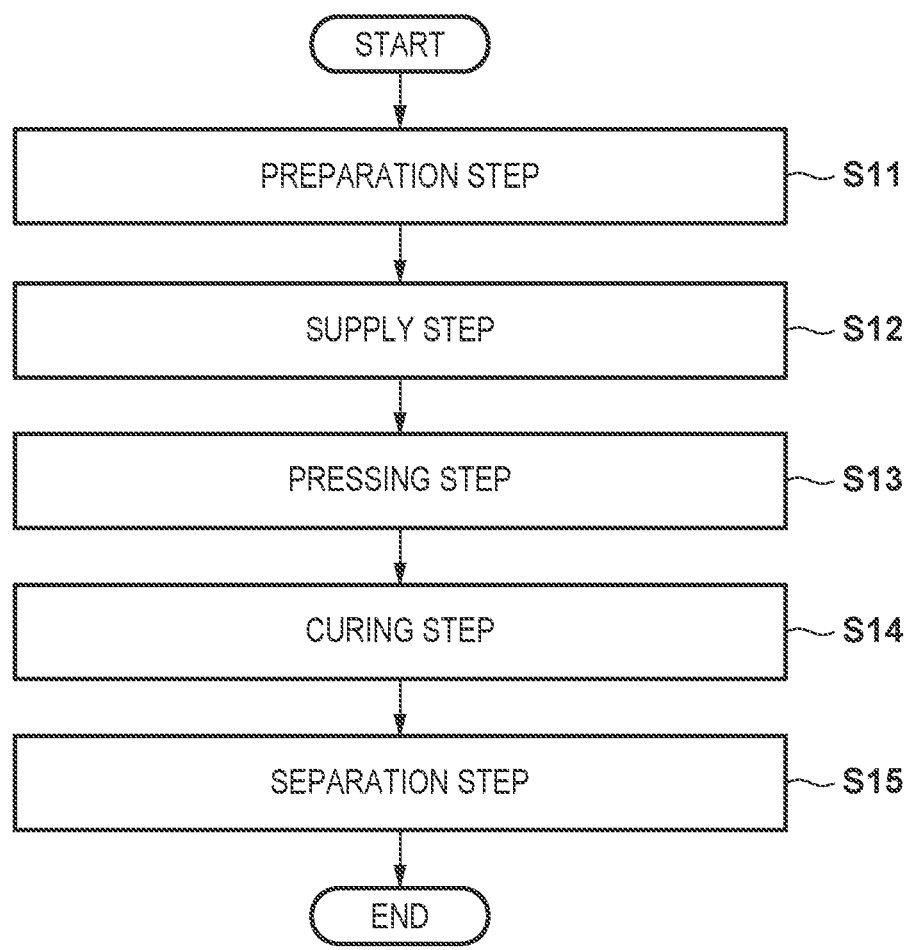
FIG. 1 is a flowchart showing a foreign particle removing method of the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

In the specification and the accompanying drawings, directions will be indicated on an XYZ coordinate system in which directions parallel to the surface (upper surface) of a member as an object of foreign particle removal are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving (movement) concerning the X-axis, the Y-axis, and the Z-axis means control or driving (movement) concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively.

First Embodiment

A foreign particle removing method of the first embodiment according to the present invention will be explained below. The foreign particle removing method of this embodiment is a method of removing foreign particles on a member (first member), more specifically, a cleaning method (so-called dry cleaning method) of removing foreign particles on the member without using any chemical solution.

Foreign Particle Removing Method

The foreign particle removing method (cleaning method) of this embodiment will be explained below with reference to FIGS. 1 and 2A to 2F. FIG. 1 is a flowchart showing the foreign particle removing method (a control method of a foreign particle removing process) of this embodiment. FIGS. 2A to 2F are schematic views for explaining steps of the foreign particle removing method of this embodiment. Note that examples shown in FIGS. 1 and 2A to 2F are merely typical examples, and the present invention is not limited to the examples shown in FIGS. 1 and 2A to 2F.

First, in step S11 (a preparation step), a member 1 (a first member) as an object of foreign particle removal is prepared. In the following explanation, the member 1 as an object of foreign particle removal will be referred to as "a target member 1" in some cases. The preparation step can also be understood as a step for loading a target member 1 into a foreign particle removing apparatus for removing foreign particles on the target member 1. A configuration example of the foreign particle removing apparatus will be described later.

Figure 2A:
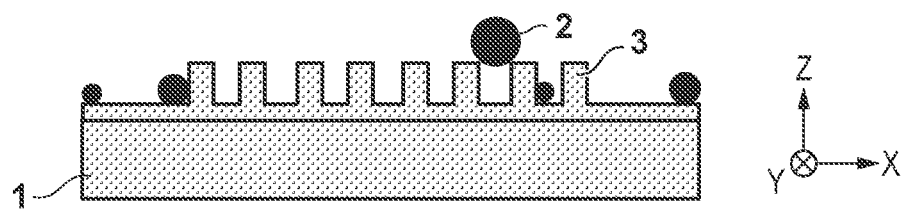
FIGS. 2A to 2F are schematic views for explaining steps of the foreign particle removing method of the first embodiment in chronological order.

As shown in FIG. 2A, the target member 1 can be a substrate on which a pattern is formed in a lithography step of manufacturing a semiconductor device or a flat panel display. Examples of the substrate are a semiconductor wafer or MEMS wafer on which a pattern (underlying pattern) is formed, a power semiconductor wafer, a display glass substrate (glass plate), or a bio-element. In this embodiment, an example in which a substrate is applied as the target member 1 will be explained. However, the target member 1 can also be an original plate to be used to form a pattern on a substrate in the lithography step. Examples of the original plate are an EUV exposure mask, a semiconductor exposure mask, a semiconductor imprint mold (template), a MEMS exposure mask, a power semiconductor exposure mask, and a display exposure mask. Note that MEMS is the abbreviation for Micro Electro Mechanical System, and EUV is the abbreviation for Extreme Ultraviolet.

In the example shown in FIG. 2A, the target member 1 has a pattern 3 with concave and convex portions (an underlying pattern) in which concave and convex portions are repeatedly (for example, periodically) formed. Foreign particles 2 (particles) having various sizes adhere on top surfaces (the upper surfaces of the convex portions) and bottom surfaces (the bottom surfaces of the concave portions) in the pattern 3 with concave and convex portions of the target member 1. It is particularly difficult to remove extremely small foreign particles having particle sizes of 30 nm or less and foreign particles adhered on the bottom surfaces of the pattern 3 with concave and convex portions by the conventional cleaning methods such as megasonic cleaning and two-fluid cleaning.

Figure 2B:
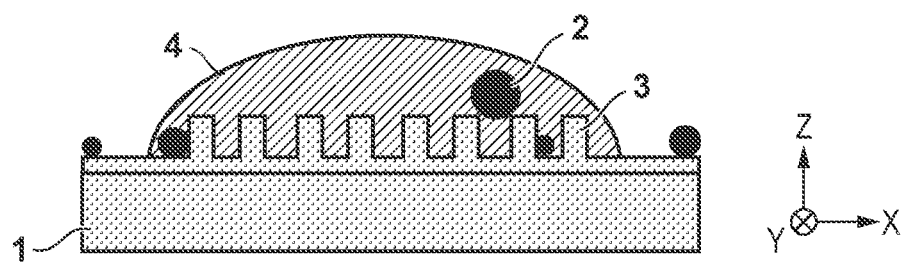

Then, in step S12 (a supply step), as shown in FIG. 2B, a composition 4 for entrapping and enclosing the foreign particles 2 on the target member 1 is supplied onto the target member 1. The composition 4 is supplied onto the target member 1 in a state in which the composition 4 has fluidity (that is, in a liquid state).

As the composition 4, a curable composition (for example, a resin) to be cured by receiving curing energy is used. The curable composition is a composition cured by light irradiation or heating. Among these, a photo-curable composition (photo-curable resin) cured by light irradiation contains at least a polymerizable compound and a photopolymerization initiator, and may further contain a nonpolymerizable compound or a solvent, as needed. The polymerizable compound is a compound that reacts with a polymerizing factor (a radical or the like) generated from the photopolymerization initiator and forms a film made of a polymer compound by a chain reaction (polymerization reaction). An example of the polymerizable compound is a radical polymerizable compound. The polymerizable compound is preferably a compound having one or more acryloyl groups or methacryloyl groups, that is, a (meth)acryloyl compound. The nonpolymerizable compound is at least one material selected from the group consisting of a sensitizer, a hydrogen donor, an internal mold release agent, a surfactant, an antioxidant, and a polymer component. Note that the viscosity (the viscosity at 25° C.) of the composition 4 is, for example, from 1 mPa·s (inclusive) to 100 mPa·s (inclusive).

In this embodiment, the composition 4 can be supplied (applied) on the target member 1 by using an apparatus that discharges the composition 4 by an inkjet method. However, the method of supplying (applying) the composition 4 on the target member 1 is not limited to the inkjet method, and it is possible to use any method capable of controlling the supply amount (for example, the coating film thickness of the composition 4) of the composition 4 onto the target member 1. For example, the composition 4 can be supplied on the target member 1 by using dispenser coating, spin coating, various printing methods such as screen printing, gravure printing, and offset printing, and dip coating.

The wettability of the surface of the target member 1 is preferably as high as possible so that air bubbles are not involved between the target member 1 and the composition 4 and/or the composition 4 easily spreads on the target member 1. That is, it is favorable to minimize the contact angle between the target member 1 and the composition 4. The allowable range of this contact angle is preferably 2° or less, and more preferably 1° or less.

For this purpose, before the supply step (step S12), a process (lyophilization process (hydrophilization process)) of lyophilizing (hydrophilizing) the surface of the target member 1 with respect to the composition 4 is preferably performed on the target member 1. This lyophilization process includes a process of removing organic contamination components on the target member 1. Examples of the lyophilization process are heat treatment, plasma ashing, atmospheric plasma treatment, alkali cleaning, and ozone water washing. As the lyophilization process, this embodiment can use the atmospheric plasma treatment that can be implemented with a simple apparatus configuration. When the composition 4 is supplied on the target member 1 after the surface of the target member 1 is lyophilized in advance as described above, the capillary force allows the composition 4 to easily penetrate narrow channels (gaps) between the target member 1 and the foreign particles 2 adhered on it. Note that the lyophilization process can also be performed by an external apparatus of the foreign particle removing apparatus before the preparation step (step S11), for example, before the target member 1 is loaded into the foreign particle removing apparatus. Note also that a separation layer (for example, a fluorine-based layer) for facilitating separation (release) between the target member 1 and the composition 4 in a separation step (step S15) (to be described later) can be formed on the target member 1 before the supply step (step S12).

Figure 2C:
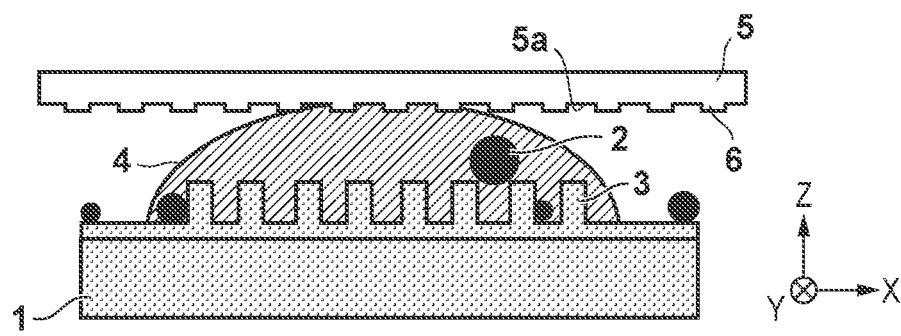
Figure 2D:
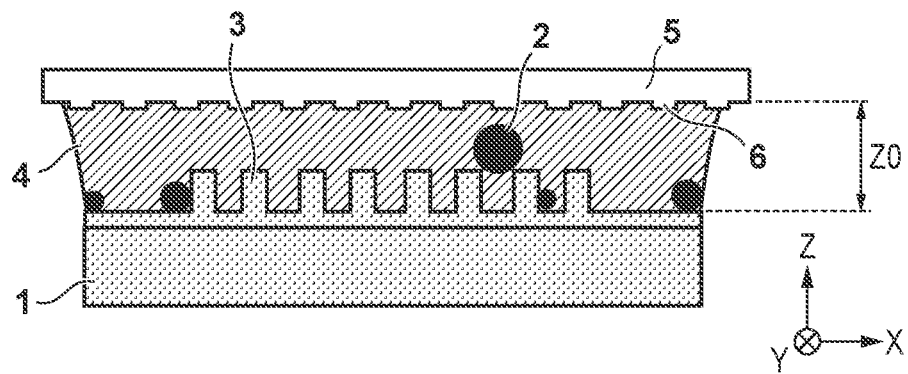

Subsequently, in step S13 (a pressing step), a template 5 is pressed against the composition 4 on the target member 1 so that the composition 4 spreads on the target member 1. More specifically, in this pressing step, after the template 5 is brought into contact with the composition 4 supplied on the target member 1 in the supply step as shown in FIG. 2C, the composition 4 is spread on the target member 1 by the template 5 as shown in FIG. 2D. In this step, the template 5 is pressed against the composition 4 on the target member 1 so that the composition 4 spreads over a target range of the target member 1 and entraps the foreign particles 2 within this target range. The target range of the target member 1 is a range within which foreign particles must be removed, and set on the whole surface of the target member 1 in this embodiment. Note that the pressing step can be executed by a driving mechanism that drives the target member 1 and the template 5 relative to each other.

The template 5 is a member (second member) playing the role of a handle for spreading, on the target member 1, the composition 4 supplied on the target member 1 in the supply step, and for separating (releasing) the composition 4 cured in a curing step (to be described later) from the surface of the target member 1. A press surface 5a (a surface to be pressed against the composition 4) of the template 5 can be formed into a flat surface. In this embodiment, however, the press surface 5a has a pattern 6 with concave and convex portions (a second pattern with concave and convex portions) for increasing the adhesion between the composition 4 and the template 5. The pattern 6 with concave and convex portions formed on the press surface 5a of the template 5 can be formed as a pattern in which concave and convex portions are repeatedly (for example, periodically) formed. Also, the template 5 is preferably formed to have a size larger than the target range of the target member 1, in order to effectively clean the whole target range of the target member 1. In this embodiment, the target range is set on the entire surface of the target member 1, so the template 5 can be formed to have a size larger than the target member 1.

Figure 2E:
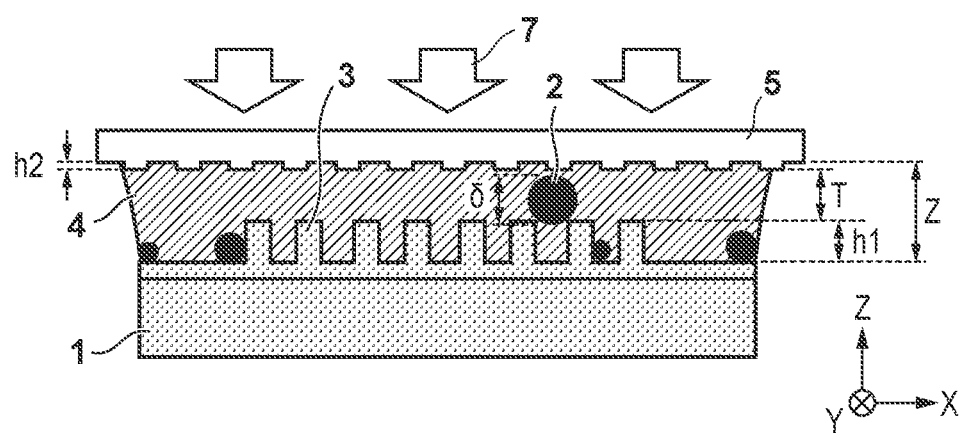

Then, in step S14 (a curing step), as shown in FIG. 2E, the composition 4 is cured by giving energy 7 to the composition 4 in a state in which the composition 4 on the target member 1 and the template 5 are in contact with each other. For example, when a photo-curable resin (for example, an ultraviolet curable monomer) is used as the composition 4, light (ultraviolet light) as the energy 7 is emitted (given) to the composition 4 through the template 5. In this case, the template 5 is preferably formed by a material capable of transmitting light (ultraviolet light), such as quartz. The composition 4 is not limited to a material that cures when irradiated with ultraviolet light, and can also be a material that cures by a polymerization reaction when irradiated with another energy such as X-ray or visible light, or a material that cures by thermal energy.

Figure 2F:
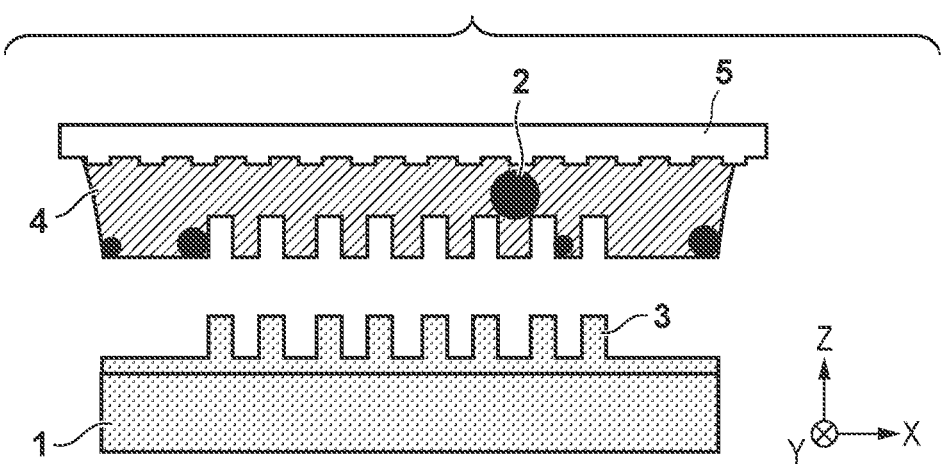

Subsequently, in step S15 (a separation step), as shown in FIG. 2F, the composition 4 is separated (released) from the target member 1 by extending the interval between the template 5 and the target member 1 in a state in which the composition 4 cured in the curing step and the template 5 adhere to each other. That is, the template 5 is separated together with the composition 4 from the target member 1 in a state in which the cured composition 4 including the foreign particles 2 and the template 5 adhere to each other. By using the separation step like this, it is possible to efficiently remove the foreign particles 2 on the target member 1 by simple processing, that is, to effectively clean the target member 1, and this is advantageous in throughput as well.

To perform the abovementioned separation step, the adhesion between the template 5 and the composition 4 must be higher than that between the target member 1 and the composition 4. In this embodiment, the pattern 6 with concave and convex portions is formed on the press surface 5a of the template 5 as described above. In addition to or instead of that, a pre-process of improving the adhesion between the template 5 and the composition 4 can also be performed on the template 5. This pre-process is a process to be performed before the pressing step (step S13), and can include a film formation step of forming (applying) an adhesive film (adhesive layer) that adheres to the composition 4, on the surface (the press surface 5a) of the template 5. This film formation process can be performed by a general thin film formation method such as spraying, vapor deposition, or spin coating. The pre-process (an application process) can also be performed by an external apparatus of the foreign particle removing apparatus before the template 5 is loaded into the foreign particle removing apparatus.

The wettability of the surface (the press surface 5a) of the template 5 is preferably as high as possible so that air bubbles are not involved between the template 5 and the composition 4 in the pressing step and/or the composition 4 easily spreads on the template 5. That is, the contact angle between the template 5 and the composition 4 on the target member 1 is preferably decreased as much as possible in the pressing step. The allowable range of the contact angle between the template 5 and the composition 4 is preferably 2° or less, and more preferably 1° or less. This allowable range is favorably smaller than the contact angle between the target member 1 and the composition 4 by about 0.5° to 1°. For example, when a fluorine-based separation layer is formed on the target member 1, the contact angle between the target member 1 and the composition 4 does not satisfy the above-described allowable range. Therefore, the spreading speed of the composition 4 on the template 5 is preferably increased by decreasing the contact angle between the template 5 and the composition 4 to 1° or less.

For this purpose, a process (lyophilization process (hydrophilization process)) of lyophilizing (hydrophilizing) the surface (the press surface 5a) of the template 5 with respect to the composition 4 can be performed on the template 5 before the pressing step (step S13). This lyophilization process can include a process of removing organic contamination components on the surface (the press surface 5a) of the template 5. Examples of the lyophilization process are heat treatment, atmospheric plasma treatment, ashing, alkali cleaning, and ozone water washing. In this embodiment, the atmospheric plasma treatment that can be implemented with a simple apparatus configuration can be used as the removing process. By thus lyophilizing the surface (the press surface 5a) of the template 5, it is possible to decrease the contact angle between the template 5 and the composition 4 in the pressing step, and facilitate spreading of the composition 4 on the template 5. Note that the lyophilizing process can also be performed by an external apparatus of the foreign particle removing apparatus before the template 5 is loaded into the foreign particle removing apparatus.

Supply Amount of Composition 4

Figure 3A:
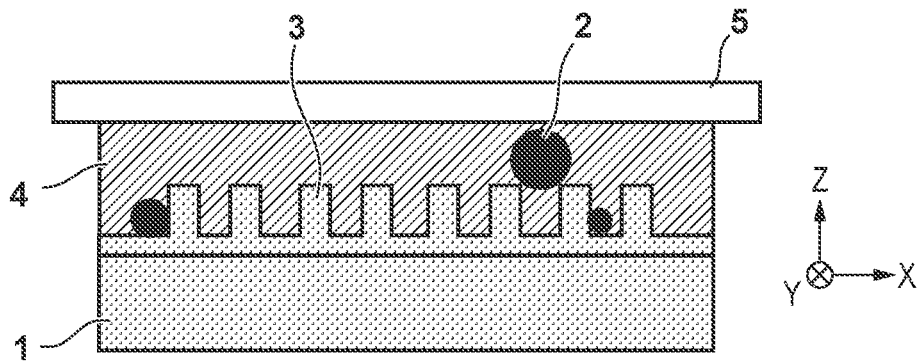
FIGS. 3A to 3C are views for explaining a problem in a pressing step.
Figure 3B:
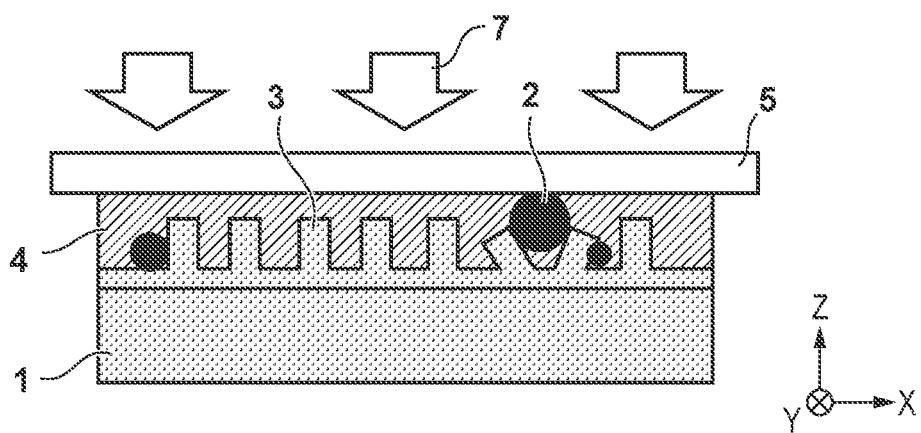
Figure 3C:
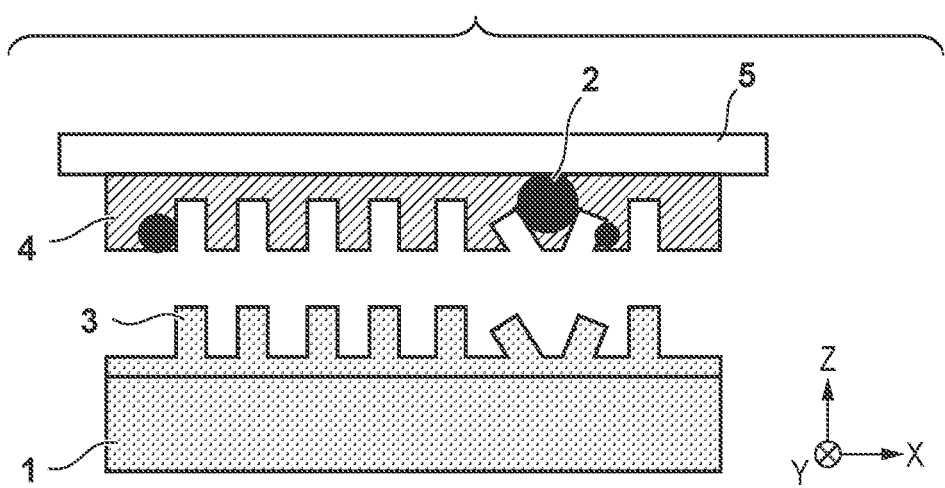
Figure 4A:
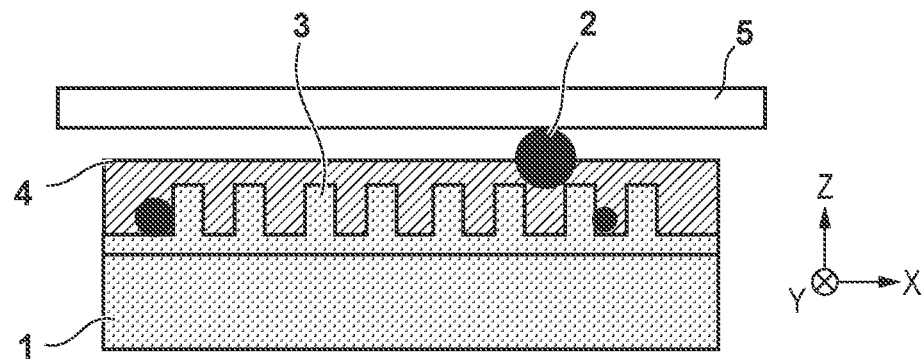
FIGS. 4A to 4C are views for explaining a problem in the pressing step.
Figure 4B:
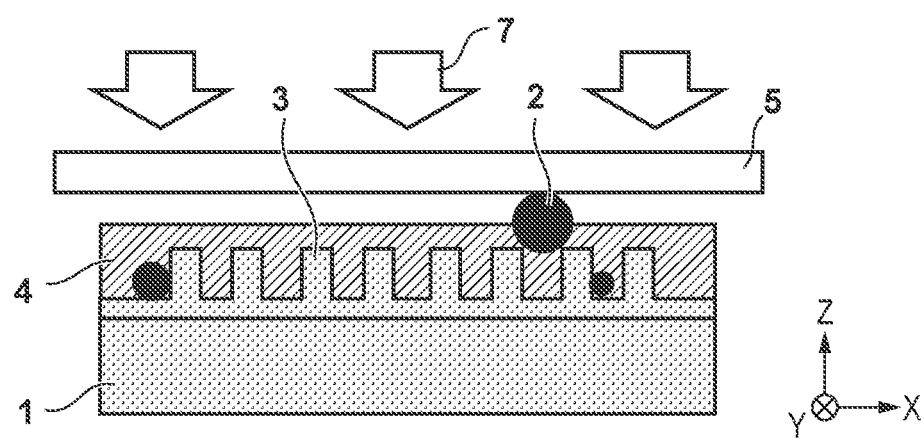
Figure 4C:
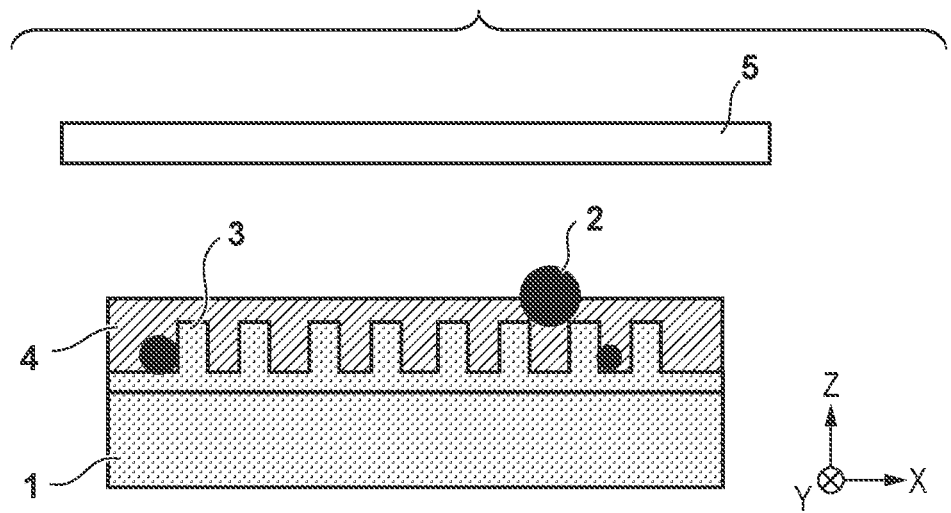
Figure 5A:
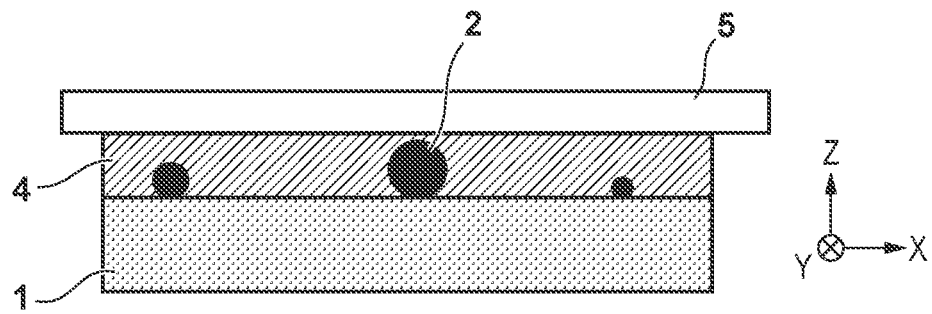
FIGS. 5A to 5C are views for explaining a problem in the pressing step.
Figure 5B:
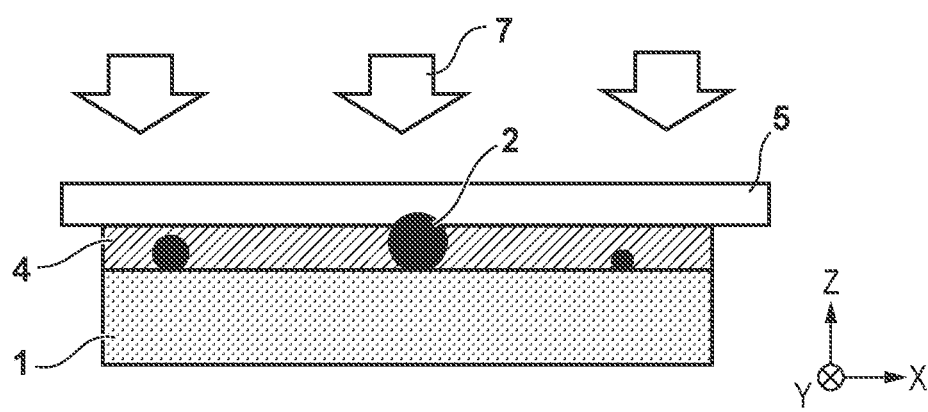
Figure 5C:
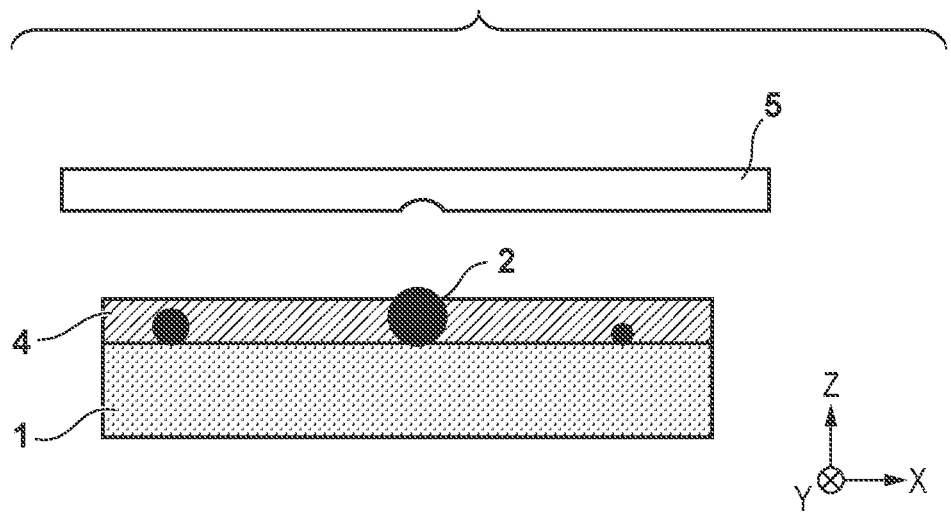

The supply amount (target supply amount) of the composition 4 to be supplied on the target member 1 in the supply step will be explained below. As described above, the foreign particle removing method of this embodiment includes the curing step (step S14) of curing the composition 4 containing the foreign particles 2 between the target member 1 and the template 5. Since the composition 4 cures and shrinks in this curing step, the target member 1 (the pattern 3 with concave and convex portions) and the template 5 may be damaged as shown in FIGS. 3A to 3C, depending on the size of a foreign particle entrapped in the composition 4. In addition, as shown in FIGS. 4A to 4C, the adhesive force between the template 5 and the composition 4 becomes insufficient, so the template 5 cannot be separated together with the composition 4 from the target member 1 in some cases. Furthermore, the target member 1 has the pattern 3 with concave and convex portions in the above-mentioned examples, but the present invention is also applicable to a case in which the target member 1 is planarized beforehand, as shown in FIGS. 5A to 5C. Even in this case, separation is sometimes impossible because the adhesive force between the template 5 and the composition 4 is insufficient, or the template 5 or the substrate 1 is damaged in some cases due to the influence of a foreign particle as shown in FIG. 5C, depending on the size of a foreign particle entrapped in the composition 4. In the supply step (step S12) of this embodiment, therefore, cure shrinkage of the composition 4 in the later curing step is taken into consideration, and the composition 4 is supplied on the target member 1 so as to reduce the influence of the foreign particle 2 entrapped in the composition 4. Note that FIGS. 3A to 3C, 4A to 4C, and 5A to 5C correspond to FIGS. 2D, 2E, and 2F and illustrate the pressing step, the curing step, and the separation step, respectively.

The target supply amount of the composition 4 to be supplied on the target member 1 in the supply step is controlled based on information indicating the cure shrinkage rate of the composition 4 in the curing step, and the size (to be also referred to as an estimated size hereinafter) of the foreign particle 2 presumably adhered on the target member 1. More specifically, the supply amount of the composition 4 is controlled based on the cure shrinkage rate and the estimated size, such that a thickness T (see FIG. 2E) of a portion of the composition 4 cured in the curing step, which exists between the template 5 and the convex portion of the pattern 3 with concave and convex portions of the target member 1, becomes larger than an estimated size δ. When the pattern 6 with concave and convex portions is formed on the press surface 5a of the template 5, the thickness T can be defined as the thickness of a portion of the composition 4 cured in the curing step, which exists between the convex portion of the pattern 3 with concave and convex portions of the target member 1 and the convex portion of the pattern 6 with concave and convex portions of the template 5. Note that as shown in FIGS. 5A to 5C, when the surface of the target member 1 is a flat surface or is substantially flat, the concave and convex portions of the target member 1 and the template 5 are very small, so the thickness T of the composition 4 is larger than the estimated size δ of a foreign particle. Therefore, the application amount of the composition 4 must be so controlled as to be larger than the thickness after cure shrinkage. This is so because, if not, the template 5 and/or the target member 1 may be damaged as shown in FIG. 5C. A practical application amount can be examined by assuming that h1=h2=0 (there are no concave and convex portions) in equation (1) to be described later.

The estimated size can be defined as a typical size (preferably a maximum size) of the foreign particles 2 presumably adhered on the target member 1. For example, the estimated size can be a typical size (maximum size) of the foreign particles 2 estimated based on the result of measurement (inspection) performed on the sizes of the foreign particles 2 adhered on the target member 1 in advance. In this case, a step of measuring (inspecting) the sizes of the foreign particles 2 adhered on the target member 1 and obtaining (calculating) the estimated size based on the measurement result can be performed before the supply step. The estimated size can also be a typical size (maximum size) of foreign particles estimated based on the result of measurement of the sizes of foreign particles adhered on a sample member different from the target member 1. In this case, a step of measuring (inspecting) the sizes of foreign particles adhered on the sample member and obtaining (calculating) the estimated size based on the measurement result can be performed before the supply step. A plurality of sample members can be used, and they are preferably members having undergone processes and steps performed by an apparatus similar to those used for the target member 1. Note that the sample member is a member different from the target member 1 in this embodiment, but the target member 1 may also be included as one of a plurality of sample members. Note also that the estimated size may also be a typical size (maximum size) of the foreign particles 2 estimated from a calculation (simulation) based on empirical rules (statistical values).

The target supply amount of the composition 4 to be supplied on the target member 1 in the supply step can be calculated (decided) so as to satisfy equation (1) to be described later. Parameters in equation (1) are as shown in FIG. 2E, that is, "h1" indicates the height of a convex portion (the depth of a concave portion) of the pattern 3 with concave and convex portions of the target member 1, and "h2" indicates the height of a convex portion (the depth of a concave portion) of the pattern 6 with concave and convex portions of the template 5. "δ" indicates the estimated size of the foreign particles 2. "Z" indicates the film thickness of the whole composition 4 cured in the curing step, that is, the thickness of the cured composition 4 between the bottom surface of the concave portion of the pattern 3 with concave and convex portions of the target member 1 and the bottom surface of the concave portion of the pattern 6 with concave and convex portions of the template 5. The height h1 of the convex portion of the pattern 3 with concave and convex portions of the target member 1 can be obtained from the result of measurement of the height distribution of the target member 1 performed by a measurement apparatus installed outside the foreign particle removing apparatus, and can also be obtained from design data of the target member 1. Likewise, the height h2 of the convex portion of the pattern 6 with concave and convex portions of the template 5 can be obtained from the result of measurement of the height distribution of the template 5 performed by a measurement apparatus installed outside the foreign particle removing apparatus, and can also be obtained from design data of the template 5.

$$\alpha(h1+h2+\delta) \leq Z \leq \beta(h1+h2+\delta) \quad (1)$$

"α" in equation (1) is a parameter (film thickness lower-limit parameter) for defining the lower limit of the film thickness Z of the composition 4, and is set as a reciprocal (that is $\alpha=1/\kappa$) of a cure shrinkage rate κ of the composition 4 in the curing step. In this embodiment, 1.25 is applied as the film thickness lower-limit parameter α because the composition 4 having a cure shrinkage rate κ of 0.8 is used.

"β" is a parameter (film thickness upper-limit parameter) for defining the upper limit of the film thickness Z of the composition 4. If the amount of the composition 4 supplied on the target member 1 in the supply step is too much, the composition 4 does not cure to a target hardness (target viscosity) in the curing step, that is, undercure occurs. This may pose problems that the foreign particle removing rate decreases, and a portion of the composition 4 remains on the target member 1 in the subsequent separation step. Also, if the amount of the composition 4 supplied on the target member 1 in the supply step is too much, the emission time of energy for curing the composition 4 to the target hardness in the curing step prolongs, and this may decrease the throughput. Therefore, the film thickness upper-limit parameter β can be set such that the time necessary for the composition 4 to cure to the target hardness in the curing step is equal to or smaller than a threshold value. This threshold value can be set beforehand by taking account of the throughput or the like. For example, the film thickness upper-limit parameter β is preferably 100 or less, and more preferably about 10.

Abovementioned equation (1) shows that the composition 4 is supplied on the target member 1 in the supply step so that the film thickness Z of the cured and shrunk composition 4 becomes larger than the total value of the height h1, the height h2, and the estimated size δ (a maximum size) of the foreign particle 2. By controlling the supply amount of the composition 4 to be supplied on the target member 1 so as to satisfy equation (1), it is possible to reduce a phenomenon in which the target member 1 (the pattern 3 with concave and convex portions) or the template 5 (the pattern 6 with concave and convex portions) is pressed against and damaged by the foreign particle 2 in the composition 4 due to cure shrinkage of the composition 4.

This will be explained with reference to FIGS. 2D to 2E. A film thickness Z0 of an uncured composition 4 shown in FIG. 2D shrinks to the film thickness Z of a cured composition 4 shown in FIG. 2E after the curing step. Equation (2) shows the relationship between the film thickness Z0 of the uncured composition, the film thickness Z of the cured composition, and the cure shrinkage rate κ. In the supply step of this embodiment, therefore, the composition 4 is supplied on the target member 1 by adding an (extra) amount equivalent to the reduction in film thickness of the composition 4 caused by cure shrinkage in the curing step, so that the film thickness Z of the cured composition becomes larger than the estimated size δ (a maximum size) of the foreign particle 2.

$$Z0=Z/\kappa \quad (2)$$

The density (to be also referred to as the pattern density hereinafter) of the pattern 3 with concave and convex portions of the target member 1 sometimes changes from one place to another in the target member 1. Therefore, it is necessary to correct the target supply amount of the composition 4 to be supplied on the target member 1 in the supply step, in accordance with the pattern density that changes from one place to another in the target member 1. This will be explained with reference to FIGS. 6A and 6B.

Figure 6A:
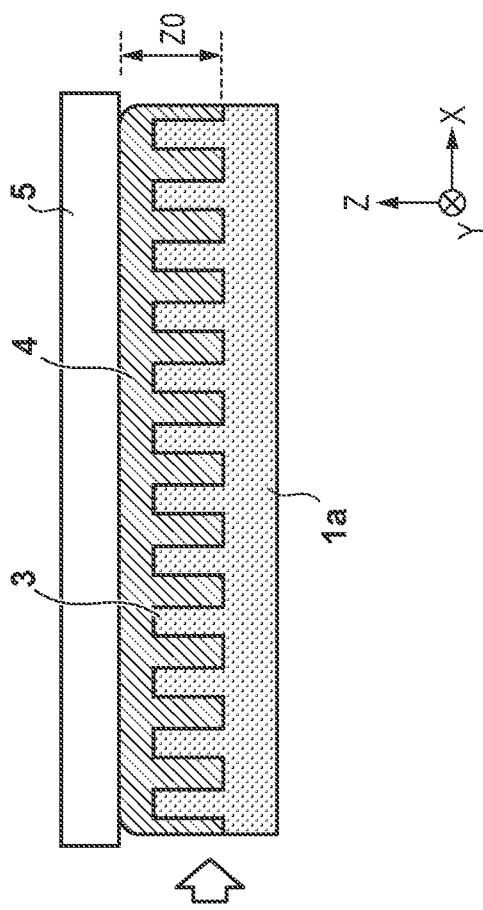
FIGS. 6A and 6B are views for explaining the supply amounts of a composition when the pattern densities of target members are different.
Figure 6B:
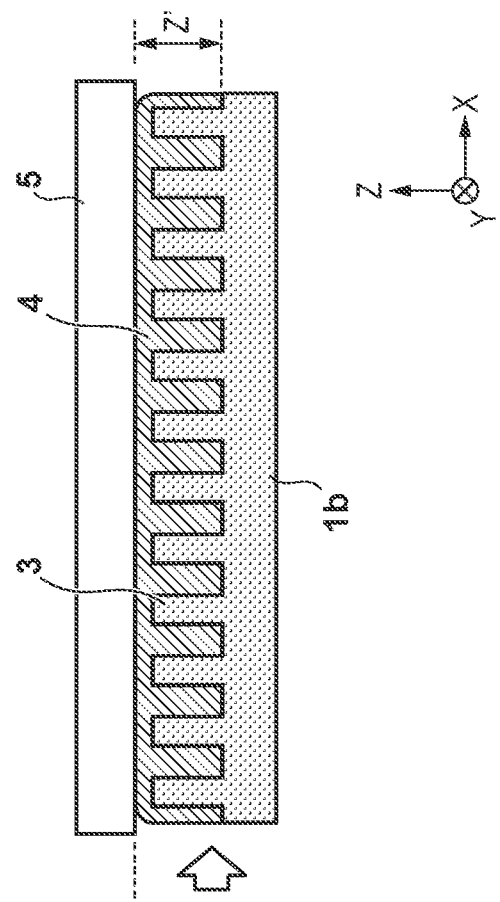

FIG. 6A shows an example of the target member 1 (to be also referred to as a uniform pattern member 1a hereinafter) in which the density (pattern density) of the pattern 3 with concave and convex portions is uniform. FIG. 6B shows an example of the target member 1 (to be also referred to as a nonuniform pattern member 1b hereinafter) having a portion not including the pattern 3 with concave and convex portions, as a portion having a different pattern density (a portion having a low pattern density). Also, the left sides of FIGS. 6A and 6B illustrate examples in which it is assumed that the composition 4 supplied on the target member 1 in the supply step is formed as a liquid film (coating film) on the target member 1 before the pressing step. The right sides of FIGS. 6A and 6B illustrate examples of the liquid film of the composition 4 formed between the target member 1 and the template 5 after the pressing step and before the curing step.

Assume, for example, that the supply amount of the composition 4 per unit area in the uniform pattern member 1a shown in FIG. 6A is the same as that in the nonuniform pattern member 1b shown in FIG. 6B, and the composition 4 is supplied by spin coating or dispenser coating. In this case, the liquid film thickness of the composition 4 in the portion where the pattern density is low in the nonuniform pattern member 1b shown in FIG. 6B is smaller than that in the uniform pattern member 1a shown in FIG. 6A. Consequently, a liquid film thickness Z' of the composition 4 after the pressing step in the nonuniform pattern member 1b is smaller than the liquid film thickness Z0 of the composition 4 after the pressing step in the uniform pattern member 1a. Accordingly, it is necessary to supply the composition 4 by an amount larger than that in the uniform pattern member 1a in order to obtain, in the nonuniform pattern member 1b, the same liquid film thickness Z0 as that of the uniform pattern member 1a having the same height h1 of the convex portion of the pattern 3 with concave and convex portions. More specifically, assume that a relative density of a convex portion based on the density of a convex portion when the liquid film thickness is Z0 in the pattern 3 with concave and convex portions is d (0≤d≤1). In this case, in the nonuniform pattern member 1*b* having a portion not including the pattern 3 with concave and convex portions (that is, a portion where d=0), the supply amount of the composition 4 in the supply step can be decided so as to satisfy equation (3) below. However, equation (3) can also be ignored if the height h1 of the convex portion of the pattern 3 with concave and convex portions is much smaller than the film thickness Z of the composition 4 after the curing step.

$$Z0=Z'+(1-d)h1 \quad (3)$$

Configuration of Foreign Particle Removing Apparatus

A configuration example of a foreign particle removing apparatus 10 will be explained below. FIG. 7 is a schematic view showing the configuration example of the foreign particle removing apparatus 10 of this embodiment. The foreign particle removing apparatus 10 of this embodiment is an apparatus that removes foreign particles on the target member 1 by executing the foreign particle removing method described above with reference to FIGS. 1 and 2A to 2F. The foreign particle removing apparatus 10 can include, for example, a stage 11, a holding device 12, a supply device 13, a first processing device 14, a second processing device 15, an image capturing device 16, a curing device 17, and a control device 18. The control device 18 is configured by a computer including a processor such as a CPU or an MPU or a logic circuit, and a storage device such as a memory, and controls a foreign particle removing process of removing foreign particles on the target member 1 by controlling each device of the foreign particle removing apparatus 10. The control device 18 can also include a communication device for communicating with an external apparatus. Note that the CPU is the abbreviation for Central Processing Unit, and the MPU is the abbreviation for Micro Processing Unit.

The stage 11 is capable of holding the target member 1 (a first member) as an object of foreign particle removal by a vacuum suction force or an electrostatic force, and movable in the X and Y directions on a baseplate BP. That is, the stage 11 is a mechanism that moves in the X and Y directions while holding the target member 1. In this embodiment, the stage 11 is so configured as to drive the target member 1 in only the X and Y directions. However, the stage 11 can also be so configured as to drive in the Z direction and the rotational direction of each axis. The holding device 12 is a mechanism that holds the template 5 (a second member) by a vacuum suction force or an electrostatic force, and drives the template 5 in the Z direction. In this embodiment, the holding device 12 is so configured as to drive the template 5 in only the Z direction. However, the holding device 12 may also be so configured as to drive the template 5 in the X and Y directions and the rotational direction of each axis. The stage 11 and the holding device 12 can form a driving mechanism for driving the target member 1 and the template 5 relative to each other.

The supply device 13 is a mechanism that supplies (discharges or applies) the liquid composition 4 on the target member 1. When the supply device 13 supplies the composition 4 on the target member 1, the stage 11 places the target member 1 below the supply device 13. The first processing device 14 is a mechanism that performs a lyophilization process on the target member 1. When the first processing device 14 performs the lyophilizing process on the target member 1, the stage 11 places the target member 1 below the first processing device 14. The second processing device 15 is a mechanism that performs a film formation process and the lyophilizing process on the template 5. The second processing device 15 of this embodiment is supported by a moving mechanism 19 movable in the X and Y directions on the baseplate BP. When the second processing device 15 performs the film formation process and the lyophilization process on the template 5, the moving mechanism 19 places the second processing device 15 below the template 5.

The image capturing device 16 is a mechanism for observing (capturing an image of) the spread of the composition 4 on the target member 1 in the pressing step described above. The image capturing device 16 can include a camera 16*a* (an image sensor) and an observation optical system 16*b*. In this example shown in FIG. 7, the image capturing device 16 is so configured as to capture an image of the spread of the composition 4 on the target member 1, via a mirror MR and the template 5. The curing device 17 is a mechanism for curing the composition 4 on the target member 1 in the above-described curing step. The curing device 17 can include an energy source 17*a* for emitting energy (for example, ultraviolet light) for curing the composition 4, and an irradiation optical system 17*b* that irradiates the composition 4 on the target member 1 with the energy emitted from the energy source 17*a*. In the example shown in FIG. 7, the curing device 17 cures the composition 4 on the target member 1 by irradiating the composition 4 with the energy, via the mirror MR and the template 5.

Operations of Foreign Particle Removing Apparatus

Operation examples of the foreign particle removing apparatus 10 of this embodiment will be explained below. A series of operations of the foreign particle removing apparatus 10 are executed by the control device 18 by transmitting a signal to each device.

Operation from Loading of Target Member to Supply Step

First, a conveyor mechanism (not shown) conveys the target member 1 onto the stage 11, and the stage 11 holds the target member 1 (a preparation step). Then, the stage 11 places the target member 1 below the first processing device 14 by driving the target member 1, and the first processing device 14 performs a lyophilization process on the target member 1. As this lyophilization process, the first processing device 14 can execute a process properly selected from, for example, heat treatment, plasma ashing, atmospheric plasma processing, alkali cleaning, and ozone water washing, each of which can remove organic contamination components on the target member 1.

Then, after the stage 11 places the target member 1 below the supply device 13 by driving the target member 1, the supply device 13 supplies the liquid composition 4 on the target member 1 (the supply step). The supply device 13 can supply the composition 4 on the target member 1 by a method appropriately selected from, for example, an inkjet method, a dispenser method, and a printing method. Note that in the example shown in FIG. 7, the first processing device 14 and the supply device 13 are formed as constituent elements of the foreign particle removing apparatus 10. However, the first processing device 14 and/or the supply device 13 can also be formed as an external element (external apparatus) of the foreign particle removing apparatus 10. In this case, the target member 1 on which the lyophilization process and/or the supply of the composition 4 is performed outside the foreign particle removing apparatus 10 is loaded into the foreign particle removing apparatus 10.

A method of deciding the supply amount (target supply amount) of the composition 4 to be supplied on the target member 1 by the supply device 13 is as described above. More specifically, the control device 18 obtains information indicating the cure shrinkage rate of the composition 4, and information indicating the estimated size of a foreign particle on the target member 1. In this case, the control device 18 can also obtain information indicating the height h1 of the convex portion of the pattern 3 with concave and convex portions of the target member 1 and/or the height h2 of the convex portion of the pattern 6 with concave and convex portions of the template 5. Then, based on the cure shrinkage rate and the estimated size of the foreign particle, the control device 18 decides the supply amount of the composition 4 so that the thickness T of a portion of the composition 4 cured in the curing step, which exists between the template 5 and the convex portion of the pattern 3 with concave and convex portions of the target member 1, becomes larger than the estimated size. The control device 18 can also decide the supply amount of the composition 4 so as to satisfy equation (1) described above. Consequently, the control device 18 can control the supply device 13 by transmitting an instruction signal corresponding to the decided supply amount of the composition 4 to the supply device 13.

Operation from Loading of Template to Pressing Step

A conveyor mechanism (not shown) conveys the template 5 onto the holding device 12, and the holding device 12 holds the template 5. Then, the moving mechanism 19 places the second processing device 15 below the template 5, and the second processing device 15 performs a film formation process on the template 5. The film formation process is a process of forming an adhesive film (adhesive layer) for improving the adhesion between the template 5 and the composition 4, on the press surface 5a of the template 5, and can include surface treatment such as silane coupling treatment, silazane treatment, or deposition of a thin organic film. When an adhesive film like this is formed on the press surface 5a of the template 5, it is possible to adhere the template 5 and the composition 4 and completely separate (release) the template 5 together with the composition 4 from the target member 1 in the separation step. That is, it is possible to efficiently and reliably remove foreign particles from the target member 1. Note that the formation of the adhesive film may also be omitted depending on the components of the composition 4 or the configuration and material of the template 5.

Subsequently, the second processing device 15 performs a lyophilization process on the template 5. The second processing device 15 can execute, as the lyophilization process, a process appropriately selected from, for example, heat treatment, plasma ashing, atmospheric plasma treatment, alkali cleaning, and ozone water washing, each of which can remove organic contamination components on the template 5. Note that in the example shown in FIG. 7, the second processing device 15 is formed as a constituent element of the foreign particle removing apparatus 10. However, the second processing device 15 can also be formed as an external element (external apparatus) of the foreign particle removing apparatus 10. In this case, the template 5 having undergone the film formation process and/or the lyophilization process outside the foreign particle removing apparatus 10 is loaded into the foreign particle removing apparatus 10.

Then, after the stage 11 places (positions) the target member 1 below the template 5 by driving the target member 1, the holding device 12 moves down the template 5 and presses the template 5 against the composition 4 on the target member 1 (the pressing step). The time of the pressing step (that is, the time during which the composition is spread on the target member 1) can properly be set in accordance with the material, properties, and the like of the composition 4 so that the composition 4 can sufficiently enclose foreign particles within the target range of the target member 1.

In the pressing step, while the image capturing device 16 is observing uniformity/nonuniformity of the spread of the composition 4 on the target member 1, the pressing (for example, the parallelism and/or the pressing force) of the template 5 against the composition 4 on the target member 1 can be controlled. For example, the control device 18 can detect the outer circumference of the composition 4 and/or the edge of the target member 1 by performing well-known image processing on an image obtained from the image capturing device 16, thereby observing (monitoring) uniformity/nonuniformity of the spread of the composition 4 on the target member 1. If the nonuniformity of the spread of the composition 4 is detected, the control device 18 causes the stage 11 and the holding device 12 to control the relative postures of the template 5 and the target member 1 and/or the pressing force on the template 5 so as to correct the nonuniformity. This makes it possible to uniformly spread the composition 4 over the target range of the target member 1, and reliably remove foreign particles in the target range.

In the pressing step, a gas for accelerating disappearance of air bubbles involved between the template 5 and the target member 1 and/or avoiding defective curing of the composition 4 caused by inhibition of oxygen can be supplied from a gas supply nozzle (not shown) formed in the holding device 12. Examples of the gas are He, $H_2$, and a gas mixture thereof. However, even when air bubbles are involved between the template 5 and the composition 4, the gas need not be supplied from the gas supply nozzle if the adhesion between the template 5 and the composition 4 has no problem.

Operation from Curing Step to Release Step

When the composition 4 has spread over the target range of the target member 1 in the pressing step, the control device 18 transmits a signal giving an instruction to cure the composition 4 to the curing device 17. Upon receiving this signal, the curing device 17 emits energy (for example, ultraviolet light) for curing the composition 4 from the energy source 17a, and irradiates the composition 4 with this energy via the irradiation optical system 17b, the mirror MR, and the template 5 (the curing step). As a consequence, the composition 4 between the template 5 and the target member 1 can be cured.

In the energy source 17a, a combination of the material and the wavelength can appropriately be selected so that the emitted energy can be transmitted through the template 5. In this embodiment, the template 5 is made of quartz, so ultraviolet light having a wavelength of 365 nm is adopted as the energy to be emitted from the energy source 17a. Note that the energy to be emitted from the energy source 17a is not limited to the ultraviolet light having a wavelength of 365 nm, and it is also possible to adopt, for example, visible light, ultraviolet light having a wavelength other than 365 nm, infrared light, X-ray, radiation, or an electron beam, in accordance with the materials of the template 5 and the composition 4.

In the curing step, it is possible to appropriately set the energy intensity (light intensity) with which the composition 4 is irradiated and the irradiation time (exposure time), so that the composition 4 can sufficiently cure, that is, the composition 4 cures to the target hardness. The curing rate of the composition 4 can change in accordance with the amount of oxygen in the surrounding atmosphere. Therefore, it is also possible to detect the amount of oxygen in the peripheral atmosphere by using a sensor or the like, and set the energy intensity and/or the irradiation time based on the detection result.

In the abovementioned step, the composition 4 on the target member 1 entraps (encloses) foreign particles within the target range of the target member 1 by spreading over the target range by the capillary force and the wettability, and becomes separable from the target member 1 by shrinkage by curing (cure shrinkage).

Then, the holding device 12 raises the template 5 and separates the template 5 from the target member 1 (the separation step). Since the template 5 and the cured composition 4 adhere to each other in this state, the composition 4 is also separated together with the template 5 from the target member 1. The rate at which the template and the target member 1 are separated can be so set that the pattern of the target member 1 is not damaged. By thus separating the template 5 together with the composition 4 from the target member 1, it is possible to efficiently remove foreign particles on the target member 1 with simple processing, and this can be advantageous in throughput as well.

When separating the template 5 and the composition 4 from the target member 1, the target member 1 may be electrified (called release electrification) and may attract surrounding foreign particles by the electrostatic force in some cases. Therefore, the separation step is preferably executed while removing static electricity from the template 5, the composition 4 and/or the target member 1 by using an ionizer (not shown). Note that the composition 4 is adhered on the template 5 after the separation step is performed, the template 5 can be replaced or cleaned when performing the foreign particle removing process on a new target member 1.

When the separation step is completed, the target member 1 is separated from the stage 11 and unloaded by the conveyor mechanism (not shown). In addition, the template 5 is separated from the holding device 12 and unloaded by the conveyor mechanism (not shown). When separating the target member 1 from the stage 11 and/or when separating the template 5 from the holding device 12, it is favorable to remove electric charge by using an ionizer (not shown).

As described above, the foreign particle removing method of this embodiment controls the supply amount of the composition 4 to be supplied on the target member 1 in the supply step, based on the cure shrinkage rate and the estimated size. More specifically, the control is so performed that the thickness of a portion of the composition 4 cured in the curing step, which exists between the template 5 and the convex portion of the pattern 3 with concave and convex portions of the target member 1, becomes larger than the estimated size. This can reduce the phenomenon in which the target member 1 or the template 5 is pushed against and damaged by the foreign particle 2 in the composition 4 due to cure shrinkage of the composition 4.

Second Embodiment

The second embodiment according to the present invention will be explained below. In this embodiment, an example in which curing of a composition 4 in a curing step is controlled so as to reduce a phenomenon in which a target member 1 (a pattern 3 with concave and convex portions) or a template 5 (a pattern 6 with concave and convex portions) is pushed against and damaged by a foreign particle 2 in the composition 4 due to cure shrinkage of the composition 4. Note that this embodiment basically takes over the first embodiment and can follow the first embodiment except items to be explained below.

Figure 8:
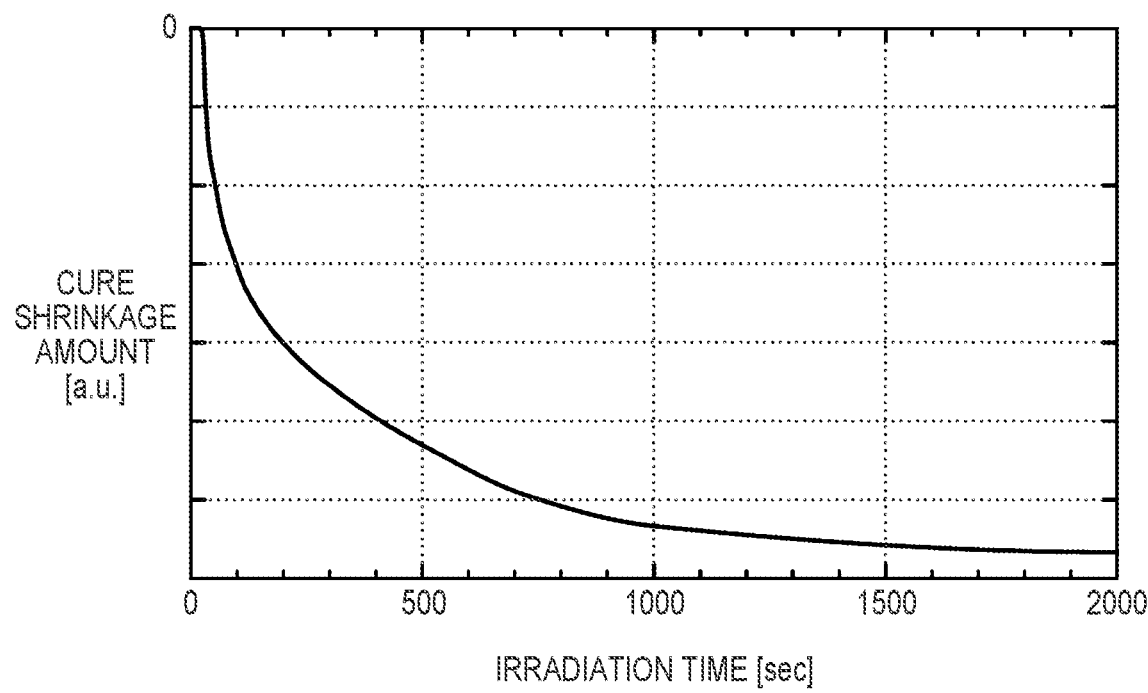
FIG. 8 is a view showing an example of shrinkage amount information.

In the curing step of this embodiment, curing of the composition 4 is controlled based on the cure shrinkage and an estimated size of a foreign particle, so that a thickness T of a portion of the composition 4 cured in the curing step, which exists between the template 5 and a convex portion of the pattern 3 with concave and convex portions of the target member 1, does not become smaller than the estimated size. For example, in the curing step, control is so performed that the thickness T does not become smaller than the estimated size, based on information (to be also referred to as shrinkage amount information hereinafter) indicating the relationship between the emission dose of energy to the composition 4 and the cure shrinkage amount of the composition 4. FIG. 8 is a view showing an example of the shrinkage amount information. The emission dose of energy to the composition 4 is represented by the time integration of the intensity (illuminance) of energy to be emitted to the composition 4. In this example shown in FIG. 8, the emission dose is represented by the emission time. The shrinkage amount information as shown in FIG. 8 can be generated beforehand by an experiment, simulation, or the like.

For example, a control device 18 calculates a liquid film thickness Z0 of the composition 4 in advance based on the supply amount of the composition 4 to be supplied on the target member 1 in a supply step. Then, in the curing step, the control device 18 successively calculates the thickness T of the portion of interest of the composition 4 based on the shrinkage amount information, and controls the cure of the composition 4 so that the thickness T does not become smaller than the estimated size. For example, the control device 18 stops curing the composition 4 when the thickness T has reached the estimated size. This makes it possible to reduce a phenomenon in which the target member 1 (the pattern 3 with concave and convex portions) or the template 5 (the pattern 6 with concave and convex portions) is pushed against and damaged by a foreign particle 2 in the composition 4 due to cure shrinkage of the composition 4. Note that in the curing step of this embodiment, the composition 4 is not completely cured in some cases. However, the composition 4 need only be cured to a hardness with which the template 5 can be separated together with the composition 4 from the target member 1 in a separation step.

Third Embodiment

The third embodiment according to the present invention will be explained below. In this embodiment, a system 100 including a foreign particle removing apparatus 10 explained in the first embodiment will be explained. This embodiment basically takes over the first embodiment and can follow the first embodiment except items to be explained below. This embodiment can also take over the second embodiment.

Figure 9:
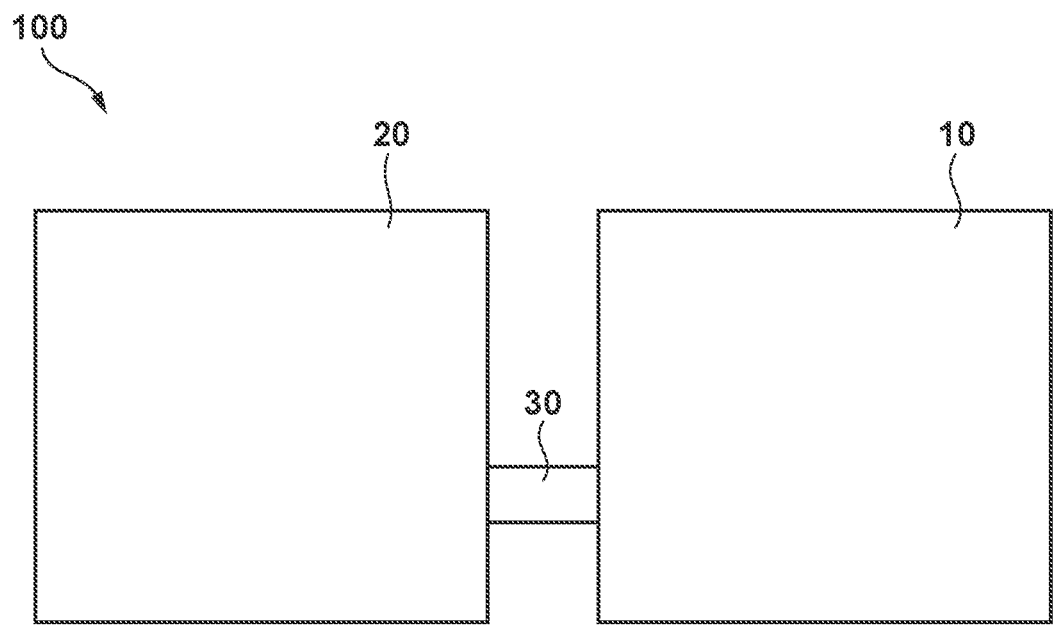
FIG. 9 is a schematic view showing a configuration example of a system including the foreign particle removing apparatus and a formation apparatus.

FIG. 9 is a schematic view showing a configuration example of the system 100 of this embodiment. The system 100 of this embodiment includes the foreign particle removing apparatus 10 and a formation apparatus 20. In the system 100 of this embodiment, a conveyor apparatus 30 connects the foreign particle removing apparatus 10 and the formation apparatus 20 by inline, and conveys a target member 1, from which foreign particles are removed by the foreign particle removing apparatus 10, into the formation apparatus 20.

As explained in the first embodiment, the foreign particle removing apparatus 10 is an apparatus for removing foreign particles on the target member 1. As described above, the target member 1 can be a substrate on which a pattern is formed by the formation apparatus 20 and/or an original plate having a pattern to be transferred onto a substrate by the formation apparatus 20. The formation apparatus 20 is an apparatus for forming a pattern on a substrate by using the target member 1 from which foreign particles are removed by the foreign particle removing apparatus 10. The formation apparatus 20 of this embodiment can be configured as a lithography apparatus for transferring a pattern of an original plate onto a substrate. For example, when the target member 1 is a substrate, the formation apparatus 20 transfers a pattern onto the substrate from which foreign particles are removed by the foreign particle removing apparatus 10. When the target member 1 is an original plate, the formation apparatus 20 transfers a pattern of the original plate from which foreign particles are removed by the foreign particle removing apparatus 10 onto a substrate. Examples of the lithography apparatus configuring the formation apparatus 20 are an exposure apparatus for exposing a substrate with pattern light having passed through an original plate (mask or reticle), and an imprint apparatus for forming a pattern of an imprint material on a substrate by using an original plate (mold).

Next, an operation example of the system 100 of this embodiment will be explained. In this embodiment, an example in which the target member 1 from which foreign particles are removed by the foreign particle removing apparatus 10 is a substrate and the formation apparatus 20 is an imprint apparatus will be explained.

A substrate is loaded into the system 100 from a coater/developer apparatus. The coater/developer apparatus can be connected inline to the foreign particle removing apparatus 10 and the formation apparatus 20 in the system 100, and can also stand alone. However, the coater/developer apparatus is preferably connected inline from the viewpoints of foreign particle adhesion and contamination. In the coater/developer apparatus, a substrate is coated with a mask material such as SOC/SOG, and conveyed to the foreign particle removing apparatus 10 connected inline.

In the system 100 of this embodiment, the foreign particle removing apparatus 10 performs a foreign particle removing process on a substrate before the substrate is loaded into the formation apparatus 20 (an imprint apparatus). This foreign particle removing process is explained in the first embodiment, so an explanation thereof will be omitted. The substrate having undergone the foreign particle removing process performed by the foreign particle removing apparatus 10 is conveyed into the formation apparatus 20 connected inline to the foreign particle removing apparatus 10, and a pattern formation process (imprint process) is performed. In this imprint process, an imprint material is supplied on the substrate, and a quartz mold (template) on which fine concave and convex portions are formed is brought into contact with the imprint material on the substrate. Then, the imprint material is cured in the state in which the imprint material on the substrate and the mold are in contact with each other, and the mold is separated (released) from the cured imprint material on the substrate. Consequently, the pattern of the mold is transferred onto the imprint material on the substrate, so the pattern of the cured product of the imprint material can be formed on the substrate.

In this imprint process, if a foreign particle exists (adheres) on the substrate, for example, if an inorganic foreign particle of about 80 nm or less exists, a mold having a pattern with concave and convex portions of about 20 nm may be damaged. Once the mold is damaged, a defect is formed on the pattern of the imprint material formed on the substrate in the subsequent imprint process using the mold. Accordingly, foreign particle management for a substrate and an original plate (mold) is a very important problem. The foreign particle removing apparatus 10 of this embodiment has a simple apparatus configuration and can remove very small foreign particles as well, and hence is very suitable as a method of solving this problem.

In the system 100 of this embodiment, after the foreign particle removing apparatus 10 performed the foreign particle removing process, the formation apparatus 20 (an imprint apparatus) performed the pattern formation process (imprint process). Consequently, it was confirmed that until an increase amount $\Delta DD$ of a defect density DD (defect/$cm^2$) became one defect/$cm^2$, the number of substrates to be processed rapidly increased from a few lots to a few hundred lots depending on the presence/absence of the foreign particle removing apparatus 10.

Embodiment of Article Manufacturing Method

An article manufacturing method according to the embodiment of the present invention is suitable for manufacturing an article, for example, a microdevice such as a semiconductor device or a device having a microstructure. The article manufacturing method of this embodiment includes a foreign particle removing step of removing foreign particles on a target member, a formation step of forming a pattern on a substrate, a processing step of processing the substrate on which the pattern is formed in the formation step, and a manufacturing step of manufacturing an article from the substrate processed in the processing step. In the foreign particle removing step, foreign particles on the target member are removed by using the abovementioned foreign particle removing method. The target member is a substrate on which a pattern is formed in the formation step and/or an original plate having a pattern to be transferred onto a substrate in the formation step. The manufacturing method further includes other known steps (oxidation, film formation, deposition, doping, planarization, etching, resist removal, dicing, bonding, packaging, and the like). The article manufacturing method of this embodiment is more advantageous than the conventional methods in at least one of the performance, quality, productivity, and production cost of the article.

When using an imprint apparatus as a formation apparatus for forming a pattern on a substrate in the formation step, the pattern of a cured product formed by the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are a mold for imprint and the like.

The pattern of the cured product is directly used as the constituent member of at least some of the above-described articles or used temporarily as a resist mask. After etching or ion implantation is performed in the substrate processing step, the resist mask is removed.

Figure 10A:
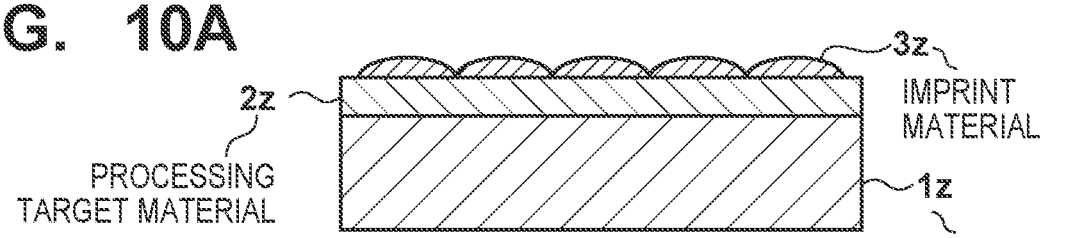
FIGS. 10A to 10F are views for explaining an article manufacturing method.

Next, a specific method of manufacturing an article will be described. In this embodiment, an example using an imprint apparatus (imprint process) will be explained. As shown in FIG. 10A, a substrate 1z such as a silicon wafer with a target material 2z to be processed, such as an insulator, formed on the surface is prepared. Next, an imprint material 3z is applied to the surface of the target material 2z by an inkjet method or the like. A state in which the imprint material 3z is applied as a plurality of droplets onto the substrate is shown here.

Figure 10B:
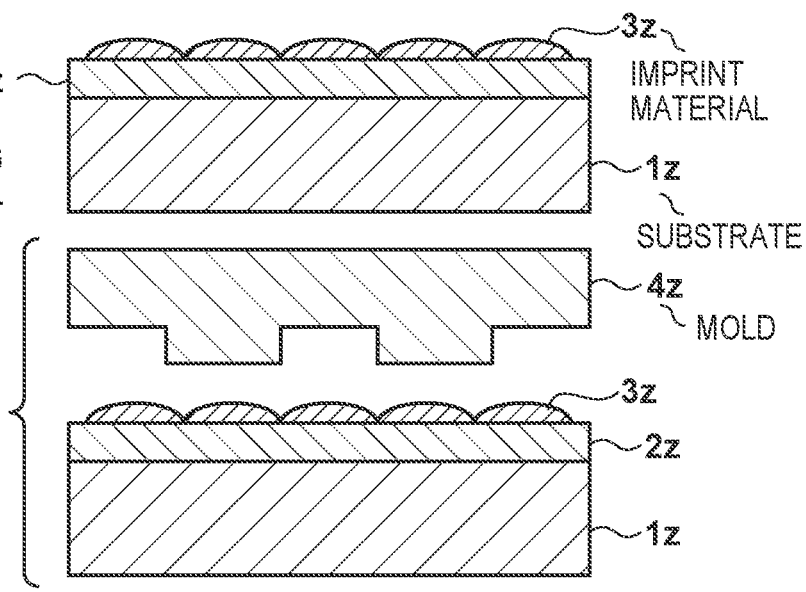
Figure 10C:
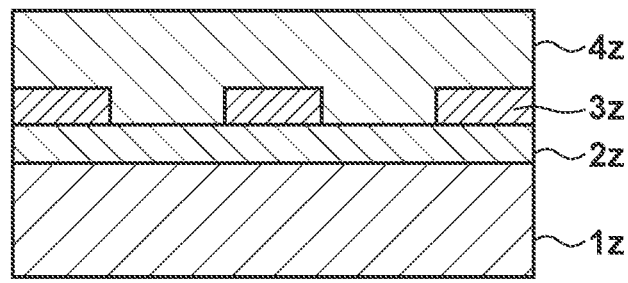

As shown in FIG. 10B, a side of a mold 4z for imprint, where a pattern with concave and convex portions is formed, is directed to face the imprint material 3z on the substrate. As shown in FIG. 10C, the mold 4z and the substrate 1z to which the imprint material 3z is applied are brought into contact with each other, and a pressure is applied. The gap between the mold 4z and the target material 2z is filled with the imprint material 3z. In this state, by irradiating the imprint material 3z with energy for curing through the mold 4z, the imprint material 3z is cured.

Figure 10D:
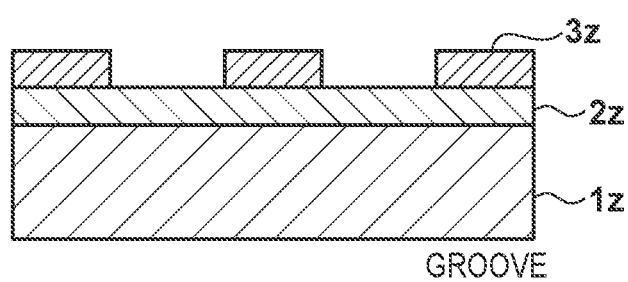

As shown in FIG. 10D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the pattern with concave and convex portions in the mold 4z is transferred to the imprint material 3z. Note that a Residual Layer Thickness portion (an RLT portion, also called a residual film thickness) (not shown) having a thickness of about a few ten nm remains in the cured concave portion.

Figure 10E:
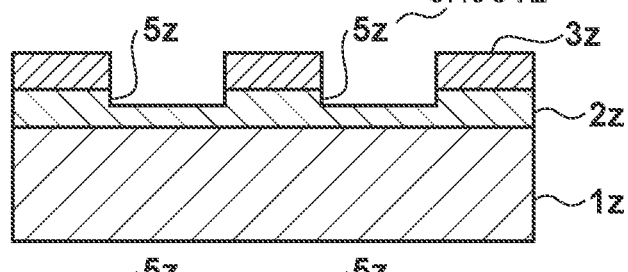
Figure 10F:
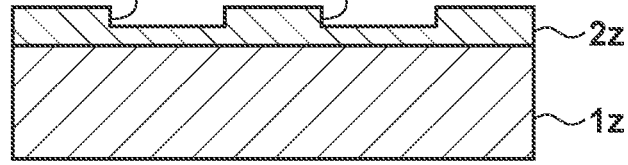

As shown in FIG. 10E, by etching the resultant material including the RLT portion by using the pattern of the cured product as an etching resistant mask, a portion of the surface of the target material 2z where the cured product does not exist or remains thin is removed to form a groove 5z. As shown in FIG. 10F, by removing the pattern of the cured product, an article with the grooves 5z formed in the surface of the target material 2z can be obtained. Here, the pattern of the cured product is removed. However, instead of removing the pattern of the cured product after processing, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-073676 filed on Apr. 27, 2022, which is hereby incorporated by reference herein in its entirety.

What is claimed is:

1. A foreign particle removing method of removing a foreign particle presumably on a first member including a first pattern with concave and convex portions, the method comprising:

supplying a composition on the first member;

pressing a second member against the composition supplied on the first member to spread the composition on the first member and entrap, in the composition, the foreign particle presumably on the first member;

curing the composition on the first member after the pressing, in a state where the composition and the second member are in contact with each other; and separating the second member together with the composition from the first member, after the curing, wherein the supplying controls a supply amount of the composition on the first member based on a cure shrinkage rate of the composition in the curing and an estimated size of the foreign particle being presumably on the first member, so that a thickness of a portion of the cured composition, which exists between the second member and a convex portion of the first pattern of the first member, becomes larger than the estimated size.

2. The method according to claim 1, wherein:

the second member includes a second pattern with concave and convex portions on a press surface to be pressed against the composition, and the supplying controls the supply amount of the composition on the first member so that the thickness of the portion of the composition cured in the curing, which exists between the convex portion of the first pattern of the first member and a convex portion of the second pattern of the second member, is larger than the estimated size.

3. The method according to claim 2, wherein:

the supplying controls letting the supply amount of the composition on the first member to satisfy:

$$\alpha(h1+h2+\delta) \leq Z,$$

where h1 is a height of the convex portion of the first pattern of the first member, h2 is a height of the convex portion of the second pattern of the second member, α is a reciprocal of the cure shrinkage rate, δ is the estimated size, and Z is a film thickness of the composition cured in the curing, and the film thickness Z of the composition is a thickness of the composition formed between a bottom surface of a concave portion of the first pattern of the first member and a bottom surface of a concave portion of the second pattern of the second member after the curing.

4. The method according to claim 3, wherein;
the supplying controls the supply amount of the composition on the first member to satisfy:

$Z \leq \beta(h1+h2+\delta)$, where β is a parameter for defining an upper limit of the film thickness Z of the composition, and the parameter β is set so that a time required for the composition to cure in the curing is not more than a threshold value.

5. The method according to claim 1, wherein the estimated size is a maximum size of the foreign particle presumably on the first member.

6. The method according to claim 1, further comprising, before the supplying, obtaining the estimated size based on a result of measurement of a size of a foreign particle on the first member.

7. The method according to claim 1, further comprising, before the supplying, obtaining the estimated size based on a result of measurement of a size of a foreign particle on a sample member different from the first member.

8. The method according to claim 1, wherein the curing controls the curing of the composition based on the cure shrinkage rate and the estimated size so that a thickness of the composition between the second member and the convex portion of the first pattern of the first member does not become smaller than the estimated size.

9. The method according to claim 1, wherein the separating separates the composition from the first member by separating the second member from the first member in a state where the second member and the composition are adhered to each other.

10. The method according to claim 1, wherein the first member is a substrate on which the first pattern is formed.

11. The method according to claim 1, wherein the first member is an original plate to be used to form the first pattern on a substrate.

12. A formation method of forming a pattern on a substrate, the method comprising:
removing a foreign particle on a first member according to the foreign particle removing method of claim 1,
wherein the first member is one of a substrate or an original plate including a pattern to be transferred onto the substrate; and
forming the pattern on the substrate.

13. An article manufacturing method comprising:
forming a pattern on a substrate according to the formation method of claim 12;
processing the substrate on which the pattern is formed; and
manufacturing an article from the processed substrate.

14. A foreign particle removing method of removing a foreign particle presumably on a first member including a pattern with concave and convex portions, the method comprising:
supplying a composition on the first member;
pressing a second member against the composition supplied on the first member to spread the composition on the first member and entrap, in the composition, the foreign particle on the first member;

curing the composition after the pressing, in a state where the composition on the first member and the second member are in contact with each other; and separating the second member together with the composition from the first member, after the curing, wherein the curing controls the curing of the composition based on a cure shrinkage rate of the composition and an estimated size of the foreign particle being presumably on the first member so that a thickness of the cured composition between the second member and a convex portion of the pattern of the first member does not become smaller than the estimated size.

15. A formation method of forming a pattern on a substrate, the method comprising:
removing a foreign particle on a first member according to the foreign particle removing method of claim 14,
wherein the first member is one of a substrate or an original plate including a pattern to be transferred onto the substrate; and
forming the pattern on the substrate.

16. An article manufacturing method comprising:
forming a pattern on a substrate according to the formation method of claim 15;
processing the substrate on which the pattern is formed; and
manufacturing an article from the processed substrate.

17. A foreign particle removing apparatus for removing a foreign particle presumably on a first member including a pattern with concave and convex portions, the apparatus comprising:
a supply device configured to supply a composition on the first member;
a holding device configured to hold and press a second member against the composition supplied on the first member;
a curing device configured to cure the composition; and
a control device configured to control
the supply device to supply the composition on the first member;
the holding device to press the second member against the composition supplied on the first member to spread the composition on the first member and entrap, in the composition, the foreign particle presumably on the first member;
the curing device to cure the composition on the first member after pressing the composition, in a state where the composition and the second member are in contact with each other; and
the holding device to separate the second member together with the composition from the first member, after curing the composition,
wherein the control device controls the supply unit to control a supply amount of the composition to be supplied on the first member based on a cure shrinkage rate of the composition during curing and an estimated size of the foreign particle being presumably on the first member, so that a thickness of a portion of the cured composition existing between the second member and a convex portion of the pattern of the first member, becomes larger than the estimated size.

18. A system comprising:
a foreign particle removing apparatus of claim 17; and
a formation apparatus configured to form a pattern on a substrate,
wherein the first member from which a foreign particle is removed by the foreign particle removing apparatus is the substrate on which the pattern is formed by the formation apparatus or an original plate including the pattern to be transferred onto the substrate.

19. A foreign particle removing apparatus for removing a foreign particle on a first member including a pattern with concave and convex portions, the apparatus comprising:
   a supply device configured to supply a composition on the first member;
   a holding device configured to hold and press a second member against the composition supplied on the first member;
   a curing device configured to cure the composition; and
   a control device configured to control:
      the supply device to supply the composition on the first member;
      the holding device to press the second member against the composition supplied on the first member to spread the composition on the first member and entrap, in the composition, the foreign particle presumably on the first member;
      the curing device to cure the composition on the first member after pressing the composition, in a state where the composition and the second member are in contact with each other; and
      the holding device to separate the second member together with the composition from the first member, after curing the composition,
   wherein the control device controls the curing device to cure the composition based on a cure shrinkage rate of the composition during curing and an estimated size of the foreign particle being presumably on the first member, so that a thickness of the cured composition existing between the second member and a convex portion of the pattern of the first member does not become smaller than the estimated size.

20. A system comprising:
   a foreign particle removing apparatus of claim 19; and
   a formation apparatus configured to form a pattern on a substrate,
   wherein the first member from which a foreign particle is removed by the foreign particle removing apparatus is the substrate on which the pattern is formed by the formation apparatus or an original plate including the pattern to be transferred onto the substrate.

* * * * *